United States Patent
Kamiyama et al.

(10) Patent No.: US 8,698,257 B2
(45) Date of Patent: Apr. 15, 2014

(54) RESONATOR AND PRODUCTION METHOD THEREOF

(75) Inventors: Tomohide Kamiyama, Osaka (JP); Tomohiro Iwasaki, Shiga (JP); Takehiko Yamakawa, Osaka (JP); Kunihiko Nakamura, Osaka (JP); Keiji Onishi, Osaka (JP)

(73) Assignee: Panasonic Corporation, Osaka (JP)

(*) Notice: Subject to any disclaimer, the term of this patent is extended or adjusted under 35 U.S.C. 154(b) by 0 days.

(21) Appl. No.: 13/377,898

(22) PCT Filed: Jun. 30, 2010

(86) PCT No.: PCT/JP2010/004321
§ 371 (c)(1),
(2), (4) Date: Dec. 13, 2011

(87) PCT Pub. No.: WO2011/001680
PCT Pub. Date: Jan. 6, 2011

(65) Prior Publication Data
US 2012/0091547 A1     Apr. 19, 2012

(30) Foreign Application Priority Data

Jun. 30, 2009  (JP) ................................. 2009-155292

(51) Int. Cl.
*H01L 29/84*  (2006.01)
(52) U.S. Cl.
USPC .................................. 257/418; 257/E29.324
(58) Field of Classification Search
CPC ... H03H 3/0072; H03H 9/2447; B81C 1/0015
USPC ...................... 257/418, E29.324; 438/52, 669
See application file for complete search history.

(56) References Cited

U.S. PATENT DOCUMENTS

2007/0284680 A1* 12/2007 Hashimura et al. ........... 257/415
2008/0266008 A1   10/2008 Hashimura

FOREIGN PATENT DOCUMENTS

| JP | 06-310029 A | 11/1994 |
| JP | 2007-005909 A | 1/2007 |
| JP | 2007-109755 A | 4/2007 |
| JP | 2007-312373 A | 11/2007 |
| JP | 2008-206140 A | 9/2008 |

OTHER PUBLICATIONS

International Search Report for PCT/JP2010/004321 dated Aug. 31, 2010.

* cited by examiner

*Primary Examiner* — Caridad Everhart
(74) *Attorney, Agent, or Firm* — Pearne & Gordon LLP

(57) ABSTRACT

A resonator using the MEMS technology is provided which improves the accuracy of a shape of electrodes so as avoid a short circuit that would otherwise be caused between input and output electrodes to thereby increase the reliability thereof. A resonator includes a substrate 101, an insulation layer 102 formed selectively on the substrate 101 as a sacrificial surface, a beam 103 formed on the substrate 101 via a space, a first support portion 104A formed on the insulation layer 102 of the same material as that of the beam 103, and electrodes formed with a space defined between the beam 103 and themselves for signals to be inputted thereinto and outputted therefrom. A sectional area of the beam 103 and a sectional area of the first support portion 104A are substantially equal in a section which is perpendicular to a longitudinal direction of the beam 103.

7 Claims, 6 Drawing Sheets

PRIOR ART  FIG. 5

RESONATOR AND PRODUCTION METHOD THEREOF

TECHNICAL FIELD

The present invention relates to a resonator which adopts the MEMS (Micro Electro Mechanical System) technology and a method for producing the same MEMS resonator and more particularly to the construction of a resonator in which the shaping accuracy of an electrode is improved.

BACKGROUND ART

Conventional MEMS resonators have a construction shown in FIG. 5. FIG. 5(a) is a perspective view of a main part of a conventional MEMS resonator, FIG. 5(b) is a top plan view of the MEMS resonator, and FIG. 5(c) is a sectional view thereof.

In FIG. 5, the resonator is formed of a support substrate 701, a first insulation layer 702 which is a sacrificial layer, a beam 703, a support portion 704 which supports the beam 703, a second insulation layer 705 which is a sacrificial layer and which forms a gap, and electrodes 706. The first insulation layer 702 functions as a spacer. In FIG. 5, for example, an SOI (Silicon On Insulator) substrate is used which is formed by forming a first insulation layer 702 which is made up of a thermal oxidation layer on a support substrate 701 which is made of a single-crystal silicon and affixing a single-crystal silicon layer thereto. An oxidation layer formed of a TEOS (Tetraethyl Ortho Silicate) is used for the second insulation layer 705, and a polycrystalline silicon is used for the electrodes 706.

In order to form a beam 703 and a support portion 704, a triangular prism-shaped structure is formed by using an anisotropic etching process. Next, an oxidation layer which forms a second insulation layer 705 and a polycrystalline silicon layer which forms electrodes 706 are formed. As this occurs, the second insulation layer 705 is removed between the beam 703 and the electrodes 706, so as to form a gap. Next, the electrodes 706 are etched. In this etching process, in the construction in which the triangular prism-shaped structure projects, irregularities are large, and because of this, it becomes difficult to implement a photolithography thereon. Thus, a process is necessary to form a resist to a desired height.

As one of methods for forming a resist, there is disclosed a method for forming a resist after electrodes 706 have been formed. FIG. 6 shows process flow diagrams of producing an MEMS resonator. Sectional views are shown on a left-hand side, and top plan views are shown on a right-hand side of the figure. In FIG. 6, (a) shows an SOI substrate which is formed by forming a first insulation layer 802 which is made up of a thermal oxidation layer on a support substrate 801 which is formed of a single-crystal silicon and further affixing a single-crystal silicon layer 803s to the first insulation layer 802, (b) shows a state in which a beam 803 and a support portion 804 which are made of a single-crystal silicon are formed by patterning the single-crystal silicon layer 803s through anisotropic etching, (c) shows a state in which a second insulation layer 805 is formed which is made of a TEOS and which defines a gap, (d) shows a state in which a polycrystalline silicon layer 806s is formed which configures electrodes, and (e) shows a state in which a resist 807 is formed to a desired height. Here, in the steps from (d) to (e), for example, the thickness of the projecting beam 803 is referred to as 3 µm, the thickness of the second insulation layer 805 is referred to as 0.3 µm, and the thickness of the polycrystalline silicon layer 806s for an electrode is referred to as 1.0 µm. When attempting to form electrodes 806 to a height which is half the height of the beam 803, a construction can be realized in which only an apex of the triangle is exposed by forming a resist 807 whose thickness is 2.4 to 2.5 µm and the other portions of the beam 803 is covered with the resist 807. For example, Patent Literature 1 describes an MEMS resonator as a related-art MEMS resonator like the one described above.

Alternatively, an opening 808 can also be formed in a resist 807 by forming the resist 807 to a thickness which could enable the planarization of the projecting portion of the beam 803 and applying an etch back to the resist 807 formed so as to cause only an apex of a triangle to be exposed. For example, when a resonator is formed by layers which are formed to the thicknesses described above, the thickness of the resist 807 needs to be 5 to 6 µm. Patent Literature 2 describes an MEMS resonator as a related-art MEMS resonator like the one described above.

Thereafter, in step (f), the polycrystalline silicon layer 806s is etched over the whole surface of the wafer so as to be cut to be separated into input and output electrodes, so that input and output electrodes 806 are formed. Then, in step (g), after the resist 807 is removed, the electrodes 806 are patterned through photolithography. Finally, in step (h), the first insulation layer 802 and the second insulation layer 805 are etched with fluorine in a gas phase so as to form a hollow construction, whereby the MEMS resonator is completed in which the beam 803 functions as a vibrator.

RELATED ART LITERATURE

Patent Literature

Patent Literature 1: JP-A-2007-312373
Patent Literature 2: JP-A-6-310029

SUMMARY OF THE INVENTION

Problem that the Invention is to Solve

However, in the method described in Patent literature 1, although a resist having a low viscosity is necessary so that the apex of the triangle is exposed, when the same resist is applied, the resist tends to be accumulated at the skirt portion of the beam having the triangular cross section, leading to a problem that the opening portion in the resist lacks in controllability. In particular, when an opening with a narrow width is attempted to be formed, it is difficult to form a resist. In addition, when an etch back is applied to the resist as done in Patent Literature 2, a curved opening portion 808 as shown in FIG. 6(e) is formed. The cause for the formation of the curved opening portion 808 is a variation in height at the beam 803 which vibrates mechanically and the support portions 804 which support the beam 803 and a variation in height thereat which is caused when the etch back is applied to the resist 807. The beam 803 and the support portions 804 have different pattern volumes and different heat dissipating efficiencies. In other words, the beam 803 has a narrow pattern, and therefore, heat tends to be confined in the vicinity of the center thereof, as a result of which the etching rate becomes high. However, the etching rate becomes low at a portion of the beam 803 which lies in the vicinity of the support portion 804 due to heat being dissipated to the support portion 804, whereby the etching rate becomes uneven at the beam 803 and the support portion 804. Consequently, no desired shape can be given to the opening portion 808 in the resist 807, this being a cause for abnormality in shape when patterning the electrode 806. Specifically speaking, the opening portion 808 in the resist becomes narrower as it approaches the support portion 804 (refer to the step (g)), and depending on a variation in processing, there is caused a possibility that the input and the output come into contact with each other to generate a short circuit.

FIG. 7 shows a copy of a photograph (an SEM photograph) showing electrodes with a failed shape which are fabricated using the conventional resist etch back process. The parallelism of the electrodes gets worse as they approach a support portion 904, and the electrodes 906 are curved towards corners thereof so that the electrodes 906 approach each other. Reference numeral 903 denotes a beam.

The invention has been made in view of the situations, and an object thereof is to provide a resonator construction which enables a highly accurate patterning.

Means for Solving the Problem

According the invention, there is provided a resonator comprising a substrate, an insulation layer which is selectively disposed on the substrate, a beam which is disposed on the substrate via a space, a first support portion which is continuous with the beam and which supports the beam, and two electrodes which are disposed on the beam via a space, ends of the two electrodes approaching each other above the beam along a longitudinal direction of the beam, wherein a sectional area of the beam and a sectional area of the first support portion are substantially equal to each other in a section which is perpendicular to the longitudinal direction of the beam.

In addition, according to the invention, there is provided a resonator production method comprising steps of providing an SOI substrate which has a substrate, a first insulation layer which is disposed on the substrate and a single-crystal silicon layer which is disposed on the first insulation layer, forming a first resist pattern on the single-crystal silicon layer, performing an anisotropic etching on the single-crystal silicon layer using the first resist pattern as a mask so as to form a beam and a first support portion which is continuous with the beam so that a sectional area of the beam and a sectional area of the first support portion are substantially equal to each other in the section perpendicular to a longitudinal direction of the beam, forming a second insulation layer over the first insulation layer, the beam and the first support portion, forming a conductive layer on the second insulation layer, forming a second resist pattern on the conductive layer, performing an etching on the conductive layer using the second resist pattern as a mask so as to form two electrodes which are made of the conductive layer and ends of the two electrodes approaching each other above the beam along the longitudinal direction of the beam, and removing partially the first insulation layer and the second insulation layer by etching so as to form spaces between the two electrodes and the beam and between the beam and the substrate.

Advantage of the Invention

According to the invention, the accuracy of the shape of the electrodes can be improved so as to avoid a short circuit between the input and output electrodes, thereby making it possible to increase the reliability of the resonator.

MODE FOR CARRYING OUT THE INVENTION

Figure 1:
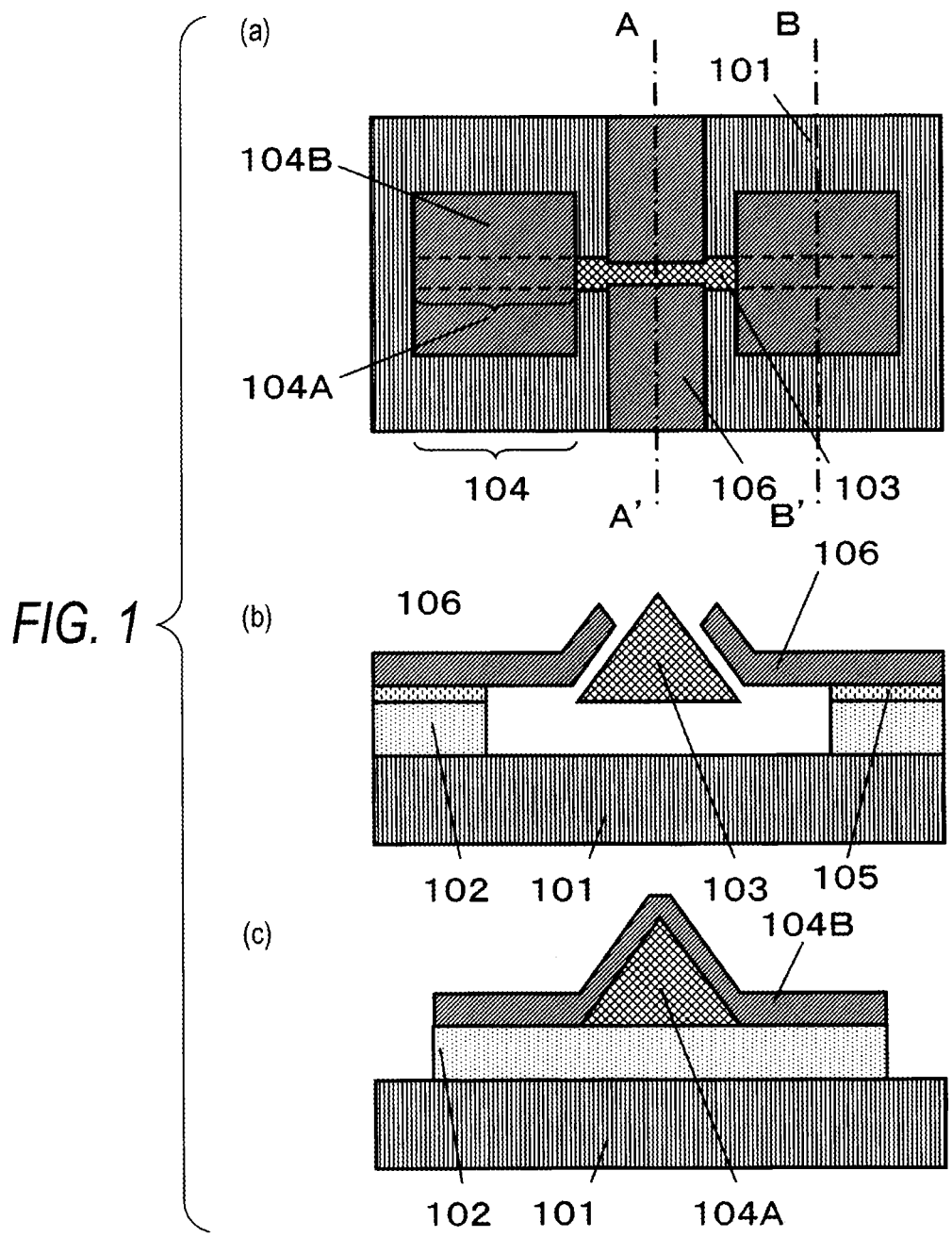
FIG. 1(*a*) is a top plan view of a resonator according to Embodiment 1 of the invention, FIG. 1(*b*) is sectional view of the resonator according to Embodiment 1 of the invention (a sectional view taken along the line A-A' in FIG. 1(*a*)), and FIG. 1(*c*) is a sectional view of the resonator according to Embodiment 1 of the invention (a sectional view taken along the line B-B' in FIG. 1(*a*)).

Prior to describing a mode for carrying out the invention, the invention and a function and advantage thereof will be described.

The inventor of the invention has found out from the results of various experiments that reaction heat is generated when a resist is etched in performing a resist etch back and a temperature distribution is generated above a beam by the flow of the heat so generated. The mechanism of generation of the temperature distribution will be as follows.

In a state resulting immediately after a resist is applied, a beam and a first support portion which are patterned are formed, and a conductive layer which forms electrodes are formed fully over the beam and the first support portion, and the resist is formed fully over the conductive layer. In reality, since the thickness of a polycrystalline silicon which forms the conductive layer is of the order of 1 μm, whereas the thickness of a single-crystal silicon which forms the beam and the first support portion is of the order of 3 μm, even after the conductive layer has been formed, irregularities remain which result from the patterning of the beam and the first support portion which lie therebelow. The resist is applied so that the irregularities on the surface of the conductive layer are planarized.

In general, specific heats of the silicon which forms the beam and the first support portion and the polycrystalline silicon are larger than that of the resist. Consequently, although reaction heat is generated when the resist is fully etched, a temperature increase in areas lying over the beam and the first support portion is smaller than those of the other areas, and a temperature distribution is generated on the surface of the resist. In addition, considering a horizontal flow of heat, heat flows into the areas lying over the beam and the first support portion from the areas therearound so as to mitigate the temperature distribution.

Here, when comparing a temperature of the area over the beam and a temperature of the area over the first support portion, in the area over the beam, since the beam has a narrow elongated shape, the area over the beam is small, and hence, the temperature is easily increased compared with heat which flows thereinto from the areas therearound. On the other hand, in the area over the first support portion, the area over the first support portion is large, and hence, the temperature is difficult to be increased compared with heat which flows thereinto from the areas therearound. Consequently, on the surface of the resist, a temperature distribution is generated so that the temperature is decreased from the beam to the first support portion. Namely, the temperature becomes high over a central portion of the beam, whereas the temperature becomes low at a portion of the beam which lies in the vicinity of the first support portion. Due to this, the etching rate becomes smaller in the area lying over an end portion of the beam than in the area lying over the central portion of the beam. Therefore, an opening in the resist becomes narrower in width at the end portion of the beam. As a result, an inter-electrode distance of electrodes which are patterned using this resist as a mask becomes small.

In contrast, according to the invention, a sectional area of the beam and a sectional area of the first support portion become substantially equal to each other in a section which is perpendicular to a longitudinal direction of the beam so that the etching rate is not decreased in the area lying over the end portion of the beam. By adopting this configuration, the etching rate can be maintained uniform in the areas lying over the central portion and the end portion of the beam.

As a specific example, according to the invention, there is provided a resonator comprising a substrate, an insulation layer which is selectively disposed on the substrate, a beam which is disposed on the substrate via a space, a first support portion which is continuous with the beam and which supports the beam, and two electrodes which are disposed on the beam via a space and of which ends approach each other along a longitudinal direction of the beam above the beam, characterized in that a sectional area of the beam and a sectional area of the first support portion are substantially equal to each other in a section which is perpendicular to the longitudinal direction of the beam.

According to this configuration, it is possible to avoid the generation of a temperature difference between the area lying over the central portion of the beam and the area lying over the end portion of the beam on the surface of the resist. Consequently, since the etching rate over the support portion and the etching rate over the beam become substantially the same, the decrease in inter-electrode distance can be prevented at the end portion of the beam. In addition, a short circuit can be avoided which would otherwise be caused by the decreased inter-electrode distance.

In the invention, it is preferable that a sectional shape of the beam and a sectional shape of the first support portion are substantially equal to each other in a section which is perpendicular to the longitudinal direction of the beam.

According to this configuration, the temperature distribution becomes substantially uniform at the first support portion and the beam, and no thermal gradient is formed, thereby making it possible to prevent a decrease in etching rate in the vicinity of the end portion of the beam. In addition, the shape of the mask may be simple, and patterning can be facilitated.

In the invention, it is preferable that a second support portion is provided further on the first support portion.

In the invention, it is preferable that the second support portion is disposed so as to cover the first support portion.

According to this configuration, the mechanical strength is increased, and a contact area is increased also when an electrical connection is effected, thereby making it possible to provide a good contacting performance.

In the invention, it is preferable that the second support portion is made of a different material from that of the first support portion.

According to this configuration, the degree of freedom in selecting materials is increased, thereby making it possible to provide the resonator which is highly reliable.

In the invention, it is preferable that the second support portion is made of the same material as that of the electrodes.

According to this configuration, the electrodes and the second support portion can be formed in the same step, thereby making it possible to suppress the increase in man-hours.

In the invention, it is preferable that the second support portion is formed in the same step as that in which the electrodes are formed.

According to this configuration, the second support portion can be formed without increasing the number of manhours.

In the invention, it is preferable that the second support portion is electrically connected to the beam.

According to this configuration, a good contact can be formed also when a desired dc-bias voltage applied to the beam.

In addition, according to the invention, there is provided a resonator production method comprising steps of preparing an SOI substrate which has a substrate, a first insulation layer which is disposed on the substrate and a single-crystal silicon layer which is disposed on the first insulation layer, forming a first resist pattern on the single-crystal silicon layer, performing an anisotropic etching on the single-crystal silicon layer using the first resist pattern as a mask so as to form a beam and a first support portion which is continuous with the beam so that a sectional area of the first support portion in a section which is perpendicular to a longitudinal direction of the first support portion is substantially equal to or smaller than a sectional area of the beam in a section which is perpendicular to a longitudinal direction of the beam, forming a second insulation layer over the first insulation layer, the beam and the first support portion, forming a conductive layer on the second insulation layer 2, forming a second resist pattern on the conductive layer, performing an etching on the conductive layer using the second resist pattern as a mask so as to form two electrodes which are made of the conductive layer and of which ends approach each other along the longitudinal direction of the beam above the beam, and removing partially the first insulation layer and the second insulation layer by etching so as to form a space between the two electrodes and the beam and between the beam and the substrate.

According to the invention, the accuracy of the shape of the electrodes can be improved so as to avoid a short circuit between the input and output electrodes, thereby making it possible to increase the reliability of the resonator.

Hereinafter, embodiments of the invention will be described by reference to the drawings.

(Embodiment 1)

FIG. 1 shows the construction of a resonator according to Embodiment 1 of the invention.

FIG. 1(a) is a top plan view of the resonator, FIG. 1(b) is a sectional view of the resonator taken along the line A-A', and FIG. 1(c) is a sectional view of the resonator taken along the line B-B'. In FIG. 1, a beam 103 is a beam which is supported at both ends thereof, and input and output electrodes 106 are disposed via a gap which is formed by etching second insulation layer 105. A support portion 104, which is made up of a first support portion 104A and a second support portion 104B which are formed of the same material as that of the beam 103, is provided to a substrate 101 via a first insulation layer 102 and the second insulation layer 105.

As shown in FIGS. 1(a) to (c), this resonator includes a substrate 101 which is made of a single-crystal silicon, a first insulation layer 102 which is formed on the substrate 101 and which forms a spacer, a beam 103 which is formed on the substrate 101 via a space which is obtained by selectively removing the first insulation layer, a first support portion 104A which is continuous with the beam 103 on the first insulation layer 102, and electrodes 106 which are formed via a gap of a predetermined width which is defined between the beam and themselves so that a signal is inputted thereinto and outputted therefrom. The resonator is characterized in that a heat capacity of the beam 103 and a heat capacity of the first support portion 104A are substantially equal. The electrodes 106 are made of a polycrystalline silicon. The first and second insulation layers 102, 105 function as sacrificial surfaces which are removed in a later step for formation of a gap. The beam 103 and the first support portion 104A form a beam structure having a triangular section, and a second support portion 104B which is made of a polycrystalline silicon is laminated on the first support portion 104A so as to cover two sides of the first insulation layer 104A. Here, it is desirable that the gap forming second insulation layer 105 is removed on the first support portion 104A so that the first support portion 104A and the second support portion 104B are brought into direct contact with each other.

FIGS. 2(a) to (h) show process flow diagrams of the resonator. Sectional views are shown on a left-hand side and top plan views are shown on a right-hand side of the figure. Hereinafter, by using FIG. 2, a production process of the resonator of this embodiment will be described.

FIG. 2(a) shows an SOI substrate, and used in this SOI substrate are a substrate 101 which is made of a silicon, which functions as a base and of which a thickness is 725 μm, a first insulation layer 102 which is made of a thermal oxidation layer and of which a thickness is 2 μm and a beam 103 which is made a single-crystal silicon 103s and of which a thickness is 3 μm.

Figure 2:
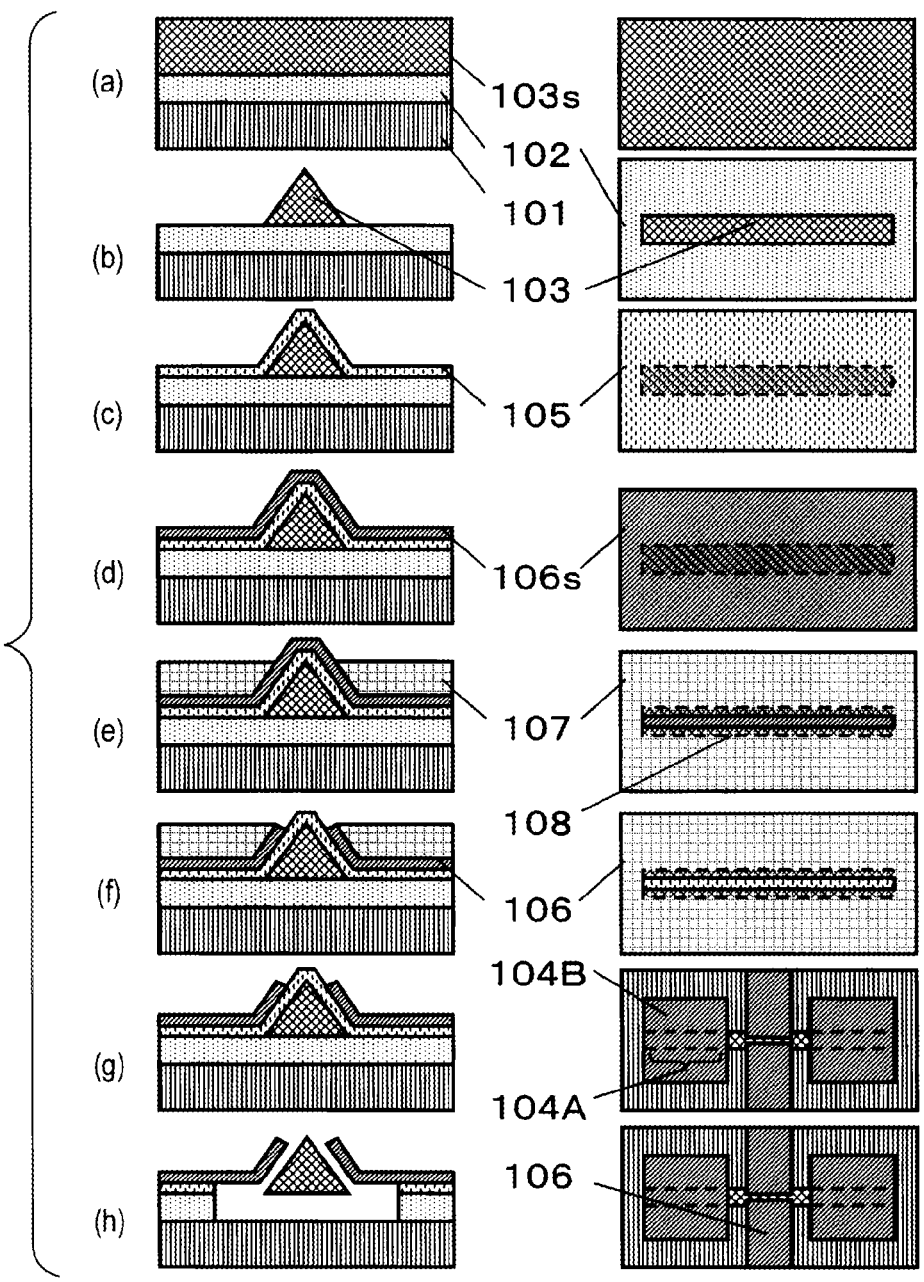
FIGS. 2(*a*) to 2(*h*) are process flow diagrams of the resonator according to Embodiment 1 of the invention.

As shown in FIG. 2(b), the beam 103 is patterned on the SOI substrate by performing an anisotropic etching on the silicon using a TMAH which is a developing solution, and a length (namely, a length in a depth direction of FIG. 2) of the beam 103 is 100 μm. In the formation of the beam 103, what is different from the conventional production method resides in a feature in which portions which form support portions are not formed and both ends of the beam 103 having the triangular section are caused to extend while keeping the same sectional shape so as to be configured as a first support portion 104A.

Following this, a second insulation layer 105 which is used as a gap forming sacrificial layer and a polycrystalline silicon layer (a conductive layer) 106s are formed continuously as shown in FIG. 2(c) and FIG. 2(d). FIG. 2(e) shows a state in which a thick resist 107 is formed and a resist etch back is applied to the resist 107 so formed so as to reduce the thickness thereof to a thickness which is half the height of the triangular prism beam to thereby form an opening portion 108. The resist used then is a resist referred to as ip5200 which is produced by Tokyo Ohka Kogyo Co., Ltd. to form a thick layer.

As shown in FIG. 2(f), the polycrystalline silicon layer (the conductive layer) 106s is patterned by performing a dry etching on the whole surface of the wafer so as to be separated into input and output electrodes 106. In the conventional production method, the pattern of the beam is discontinuous in the length direction of the beam, and the etching rate of the resist differs between the beam and the support portion. However, in the construction according to the invention, the beam and the support portion are formed so that the beam and the support portion extend continuously in the uniform width so as to keep the same cross-sectional shape. Thus, a heat capacity of a portion corresponding to the beam 103 is made equal to a heat capacity of a portion corresponding to the first support portion 104A, whereby the aforesaid problem can be solved.

As shown in FIG. 2(g), the conductive layer 106s is dry etched by photolithography after the resist 107 has been removed so as to form input and output electrodes 106 and a second support portion 104B.

In a final step, as shown in FIG. 2(h), the first insulation layer 102 and the second insulation layer 105 are removed by etching so as to form a hollow construction.

In the embodiment of the invention shown in FIG. 1, as a beam the beam 103 is considered which is made of the single-crystal silicon and which uses the SOI substrate, and therefore, a thermal oxidation layer which forms the first insulation layer 102 invariably exists underneath the beam 103. Here, when the beam 103 is released, the support portion is dislodged, which brings the beam 103 into contact with the substrate 101. Therefore, it is preferable to adopt the construction in which the first support portion 104A is encapsulated by the second support portion 104B. When adopting this construction, the beam 103 needs to electrically communicate with the second support area 104B for application of a dc-bias voltage to the beam 103. Although not shown in FIG. 2, after the second insulation layer 105 which defines a gap has been formed, the second insulation layer 105 which lies on the first support portion 104A is removed. Although the support portion is formed of two layers in FIG. 2, a configuration may be adopted in which the support portion is formed of three or more layers in order to make the support portion stronger. In addition, a configuration may be adopted in which a thermal oxidation layer which forms the first insulation layer 102 is formed on a normal silicon substrate and a beam 103 is formed of a polycrystalline silicon on the thermal oxidation layer so formed. As this occurs, in the event that the first insulation layer 102 is patterned in advance so that only the portion of the first insulation layer 102 which lies under the beam 103 is left not removed, the second support portion 104B does not have to be formed in a multiplicity of layers. In addition, a configuration may be adopted in which the electrodes 106 and the second support portion 104B are formed in separate steps using different materials so as to increase the strength of the support portion 104 further.

When the heat capacity of the beam 103 and the heat capacity of the first support portion 104A differ due to errors attributed to process variation, even in the event that a variation is caused in, for example, patterning accuracy or thickness accuracy of a layer to be formed, in case errors attributed to the variation are as small as process variation, the heat capacity of the beam 103 and the heat capacity of the first support portion 104A can be regarded as being the same, and the advantage of the invention is provided (a permissible range). In addition, when adopting a construction in which the heat capacity of the first support portion 104A is made lower than the heat capacity of the beam 103 by decreasing the volume of the first support portion 104A, the temperature increase at the first support portion 104A becomes large, and therefore, the etching rate of the first support portion 104A becomes high. As this occurs, in the opening portion 108 in the resist on the beam 103, the open portion becomes wider as the opening portion 108 approaches the support portion 104, and therefore, the occurrence of a short circuit when patterning the electrodes 106 can be avoided, thereby making it possible to obtain a similar advantage to the advantage obtained when the heat capacity of the beam 103 and the heat capacity of the first portion 104A are substantially the same.

In addition, as shown in FIG. 2, in the production process, by forming the second support portion 104B after the beam 103 has been formed, an advantage can be obtained that a variation in resonance frequency can be decreased. This is because since a wet etching is used in effecting patterning by TMAH, a variation in length becomes large when the beam 103 is formed. On the other hand, in the projection method disclosed in this invention, even in the event that the length of the beam 103 varies when the beam 103 is patterned, the substantial length of the beam 103 is regulated by the patterning step of patterning the second support portion 104B shown in FIG. 2(g).

In the resonator described above, although the second support portion 104B which mechanically reinforces the first support portion is formed on the first support portion 104A, when the second support portion 104B is formed by removing the second insulation layer 105, the second support portion 104B can electrically be connected to the first support portion 104A, and the electrical connection therebetween can be effected more efficiently when the beam is held at a desired dc-bias voltage.

In particular, the contact area can also be increased by forming the second support portion 104B so as to cover the first support portion 104A, whereby a reduction in contact resistance can be realized. In addition, the vibration of the beam can be supported in a stable fashion.

Although the input and output electrodes are made of the polycrystalline silicon, needless to say, they may be made of a metal such as aluminum. In addition, the first support portion 104A and the second support portion 104B may be made of different materials in such a way that the second support portion 104B is made of a polycrystalline silicon, whereas the first support portion 104A is made of a single-crystal silicon.

The second support portion may be made of the same material as that of the electrodes, and as this occurs, the second support portion and the electrodes can be formed in the same step.

In addition, the materials used to form the insulation layers, electrodes and resist in the embodiment described above are only examples, and hence, materials are not limited to those described but can be selected as required.

(Embodiment 2)

Figure 3:
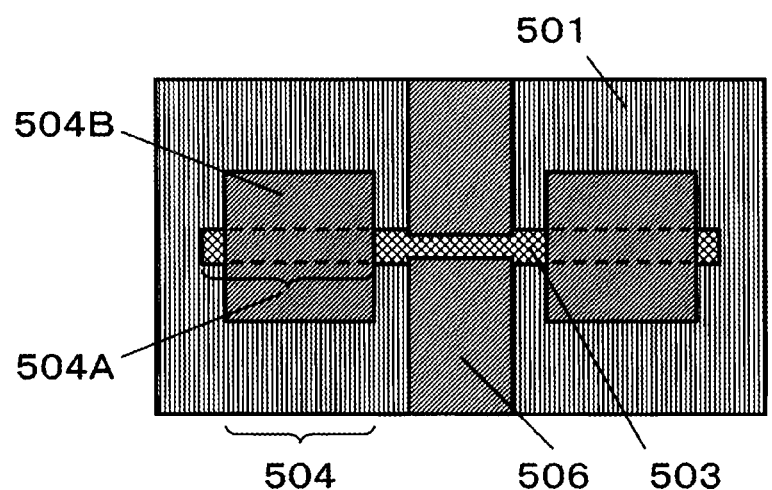
FIG. 3 is a top plan view of a resonator according to Embodiment 2 of the invention.

FIG. 3 is a top plan view of a resonator according to another embodiment or Embodiment 2 of the invention, which shows the step (g) in FIG. 2, that is, a state in which electrodes 506 are formed. In this embodiment, a construction is adopted in which distal ends of a first support portion 504A which is formed integrally with a beam 503 project outwards from a second support portion 504B. Here, reference numeral 501 denotes a substrate, and reference numeral 504 denotes a support portion. The other portions remain similar to those of the resonator of Embodiment 1.

According to this configuration, the first support portion 504A is not necessarily covered by the second support portion 504B, and hence, as shown in FIG. 3, the first support portion 504A may project outwards from the second support portion 504B, and the shape, dimensions and material for the first support portion 504A may be set freely, provided that the first support portion 504A can hold a sufficient strength as the support portion of the beam 503.

(Embodiment 3)

Figure 4:
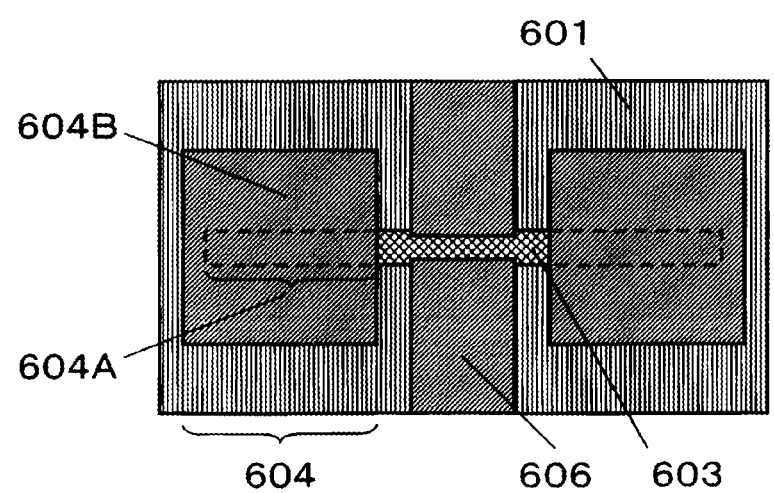
FIG. 4 is a top plan view of a resonator according to Embodiment 3 of the invention.
Figure 5:
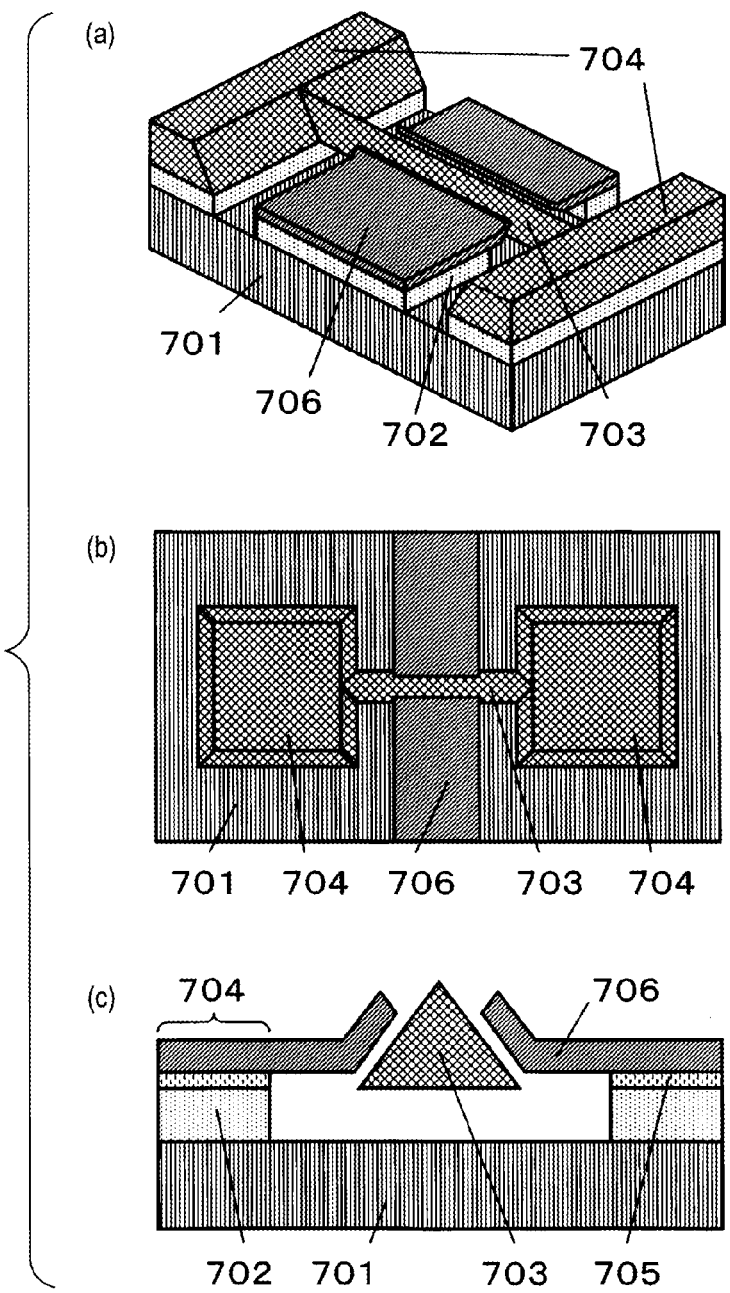
FIG. 5(*a*) is a perspective view of a conventional resonator, FIG. 5(*b*) is a top plan view of the conventional resonator, and FIG. 5(*c*) is a sectional view of the conventional resonator.
Figure 6:
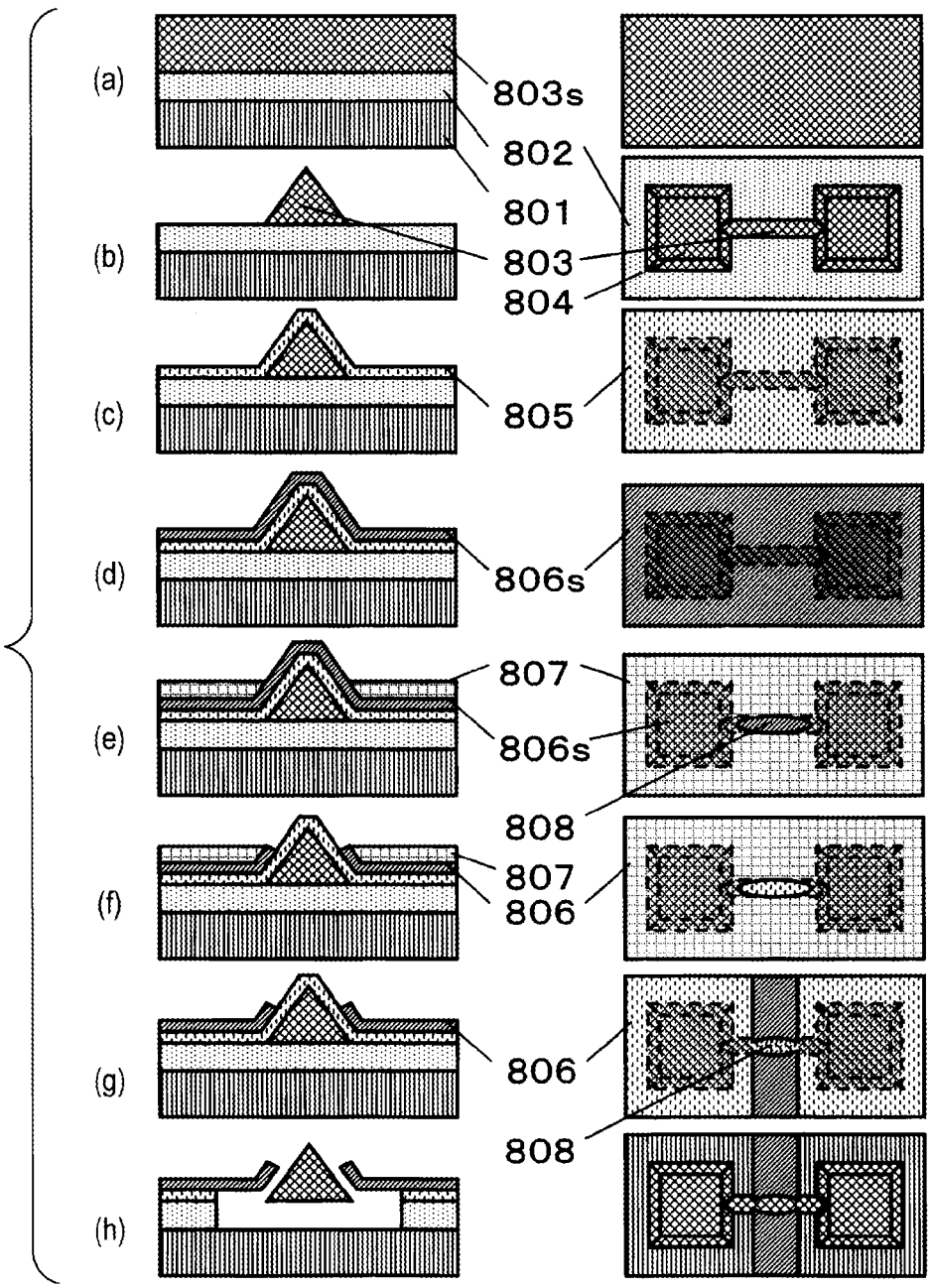
FIGS. 6(*a*) to 6(*h*) are process flow diagrams of the conventional resonator.
Figure 7:
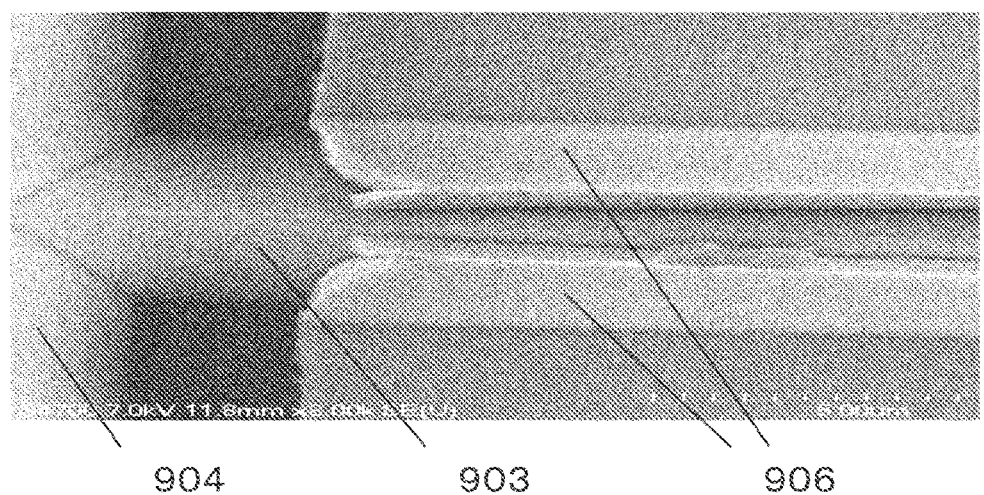
FIG. 7 is a copy of a photograph showing shapes of electrodes which are formed according to the conventional process.

FIG. 4 is a top plan view of a resonator according to a further embodiment or Embodiment 3 of the invention, which shows the step (g) in FIG. 2, that is, a state in which electrodes 606 are formed. In this embodiment, a construction is adopted in which a first support portion 604A which is formed integrally with a beam 603 is encapsulated by a second support portion 604B. Here, reference numeral 601 denotes a substrate, and reference numeral 604 denotes a support portion. The other portions remain similar to those of the resonator of Embodiment 1 and 2.

In this embodiment, too, like Embodiment 2, provided that the length of the beam 603 is regulated by an interval between the first support portions 604A and the second support portions 604B as shown in FIG. 4, no question is made as to a relationship between the first support portion 604A and the second support portion 604B with respect to a horizontal direction. An end portion (in a vertical direction) of the first support portion 604A may be covered completely by the second support portion 604B. Further, a configuration may also be adopted in which one of the first support portions 604A projects from the corresponding second support portion 604B, whereas the other of the first support portions 604A is disposed inside the corresponding second support portion 604B. In this embodiment, too, like Embodiment 2, as shown in FIG. 4, no question is made as to the positional relationship between the first support portion 604A and the second support portion 604B, and the shape, dimensions and material for the first support portion 604A may be set freely, provided that the second support portion 604B enables the first support portion 604A to hold a sufficient strength as the support portion of the beam 603.

This patent application is based on Japanese Patent Application (No. 2009-155292) filed on Jun. 30, 2009, the contents of which are to be incorporated herein by reference.

Industrial Applicability

The MEMS resonator according to the invention can improve the accuracy of the shape of the electrodes, avoid a short circuit that would otherwise be caused between the input and output electrodes and increase the reliability of the resonator. Because of this, the invention can find a wide variety of industrial applications including a resonator or oscillator which uses an MEMS resonator, a filter, a sensor, an optical scanner, a mass detection element and the like.

DESCRIPTION OF REFERENCE NUMERALS 101, 701, 801 substrate; 102, 702, 802 first insulation layer; 103, 703, 803 903 beam; 104, 704, 804, 904 support portion; 104A, 404A first support portion; 104B second support portion; 105, 705, 805 second insulation layer; 106, 706, 806, 906 electrode; 107, 807 resist; 108, 808 opening portion.

The invention claimed is:

1. A resonator comprising:
a substrate;
an insulation layer which is selectively disposed on the substrate;
a beam which is disposed above the substrate;
a first support portion which is continuous with the beam and which supports the beam; and
two electrodes which are disposed above the beam, ends of the two electrodes approaching each other above the beam along a longitudinal direction of the beam,
wherein a sectional area of the beam and a sectional area of the first support portion are substantially equal to each other in a section perpendicular to the longitudinal direction of the beam,
wherein the resonator further comprises a second support portion which is provided on the first support portion.

2. The resonator according to claim 1, wherein a sectional shape of the beam and a sectional shape of the first support portion are substantially equal to each other in the section perpendicular to the longitudinal direction of the beam.

3. The resonator according to claim 1, wherein the second support portion is disposed so as to cover the first support portion.

4. The resonator according to claim 1, wherein the second support portion is made of a different material from that of the first support portion.

5. The resonator according to claim 1, wherein the second support portion is electrically connected to the beam.

6. The resonator according to claim 1, wherein the second support portion is made of the same material as that of the electrodes.

7. The resonator according to claim 6, wherein the second support portion is formed in the same step as that in which the electrodes are formed.

* * * * *